United States Patent
Xu et al.

(10) Patent No.: US 11,081,047 B2
(45) Date of Patent: Aug. 3, 2021

(54) PIXEL STRUCTURE, DRIVING METHOD THEREFOR AND PREPARATION METHOD THEREFOR, AND DISPLAY APPARATUS

(71) Applicant: BOE TECHNOLOGY GROUP CO., LTD., Beijing (CN)

(72) Inventors: Jingbo Xu, Beijing (CN); Hu Meng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/321,968

(22) PCT Filed: May 29, 2018

(86) PCT No.: PCT/CN2018/088841
§ 371 (c)(1),
(2) Date: Jan. 30, 2019

(87) PCT Pub. No.: WO2018/223870
PCT Pub. Date: Dec. 13, 2018

(65) Prior Publication Data
US 2019/0180680 A1    Jun. 13, 2019

(30) Foreign Application Priority Data

Jun. 5, 2017  (CN) .......................... 201710413271.3

(51) Int. Cl.
*G09G 3/3225*  (2016.01)
*G09G 3/36*  (2006.01)
(Continued)

(52) U.S. Cl.
CPC ......... *G09G 3/3225* (2013.01); *G02F 1/1368* (2013.01); *G02F 1/136286* (2013.01);
(Continued)

(58) Field of Classification Search
None
See application file for complete search history.

(56) References Cited

U.S. PATENT DOCUMENTS 5,193,018 A * 3/1993 Wu ........................... G02F 1/13
349/106
8,022,725 B2  9/2011 Kim et al.
(Continued)

FOREIGN PATENT DOCUMENTS

CN   1530903 A    9/2004
CN   102832212 A  12/2012
(Continued)

OTHER PUBLICATIONS

Second Chinese Office Action dated Jul. 26, 2019.
(Continued)

*Primary Examiner* — Christopher R Lamb
(74) *Attorney, Agent, or Firm* — Dilworth & Barrese, LLP.; Michael J. Musella, Esq.

(57) ABSTRACT

Disclosed are a pixel structure, a method for driving a pixel structure, a method for preparing a pixel structure, and a display apparatus. The pixel structure includes a plurality of sub-pixel groups arranged in an array; each of the sub-pixel groups comprises a first sub-pixel electrode, a second sub-pixel electrode a first-type carbon nanotube switch tube and a second-type carbon nanotube switch tube; the first sub-pixel electrode is connected to the first-type carbon nanotube switch tube; the second sub-pixel electrode is connected to the second-type carbon nanotube switch tube; and the first-type carbon nanotube switch tube and the second-type carbon nanotube switch tube in each of the sub-pixel groups are connected to the same gate line and the same data line.

17 Claims, 4 Drawing Sheets

(51) Int. Cl.
    *H01L 27/32*         (2006.01)
    *G02F 1/1368*      (2006.01)
    *G02F 1/1362*      (2006.01)
    *G09G 3/20*         (2006.01)
    *H01L 27/12*         (2006.01)

(52) U.S. Cl.
    CPC ............. *G09G 3/20* (2013.01); *G09G 3/3614* (2013.01); *G09G 3/3648* (2013.01); *H01L 27/12* (2013.01); *H01L 27/3248* (2013.01); *H01L 27/3276* (2013.01); *G09G 2300/0426* (2013.01)

(56) References Cited

U.S. PATENT DOCUMENTS

| | | |
|---|---|---|
| 2005/0140308 A1 | 6/2005 | Park |
| 2007/0126682 A1* | 6/2007 | Liu .................. G09G 3/3648 345/92 |
| 2008/0210987 A1* | 9/2008 | Bondavalli ........ G01N 27/4146 257/253 |
| 2009/0004772 A1* | 1/2009 | Jinbo .................. H01L 27/1266 438/99 |
| 2009/0058844 A1 | 3/2009 | Takada et al. |
| 2010/0090293 A1* | 4/2010 | Zhang .................... B82Y 10/00 257/411 |
| 2012/0063204 A1 | 3/2012 | Kamata |
| 2012/0182280 A1* | 7/2012 | Park .................... G09G 3/3648 345/211 |
| 2012/0249493 A1 | 10/2012 | Chiang et al. |
| 2014/0209997 A1 | 7/2014 | Qian et al. |
| 2016/0126293 A1* | 5/2016 | Li .......................... H01L 33/06 257/29 |
| 2017/0103719 A1* | 4/2017 | Zuo ........................ G09G 3/36 |
| 2017/0179283 A1* | 6/2017 | Pourghaderi ......... H01L 29/512 |
| 2019/0180680 A1 | 6/2019 | Xu et al. |

FOREIGN PATENT DOCUMENTS

| | | |
|---|---|---|
| CN | 102955309 A | 3/2013 |
| CN | 103187038 A | 7/2013 |
| CN | 103972296 A | 8/2014 |
| CN | 106252419 A | 12/2016 |
| CN | 106356405 A | 1/2017 |
| CN | 106991956 A | 7/2017 |
| CN | 103984174 A | 8/2017 |
| JP | 2016042407 A | 3/2016 |
| KR | 100557730 B1 | 2/2006 |

OTHER PUBLICATIONS

First Chinese Office Action dated Mar. 4, 2019.
International Search Report and Written Opinion dated Sep. 3, 2018.

* cited by examiner

| P11 + | P12 − | P13 + | P14 − | P15 + | P16 − |
|---|---|---|---|---|---|
| P21 − | P22 + | P23 − | P24 + | P25 − | P26 + |
| P31 + | P32 − | P33 + | P34 − | P35 + | P36 − |

• • •

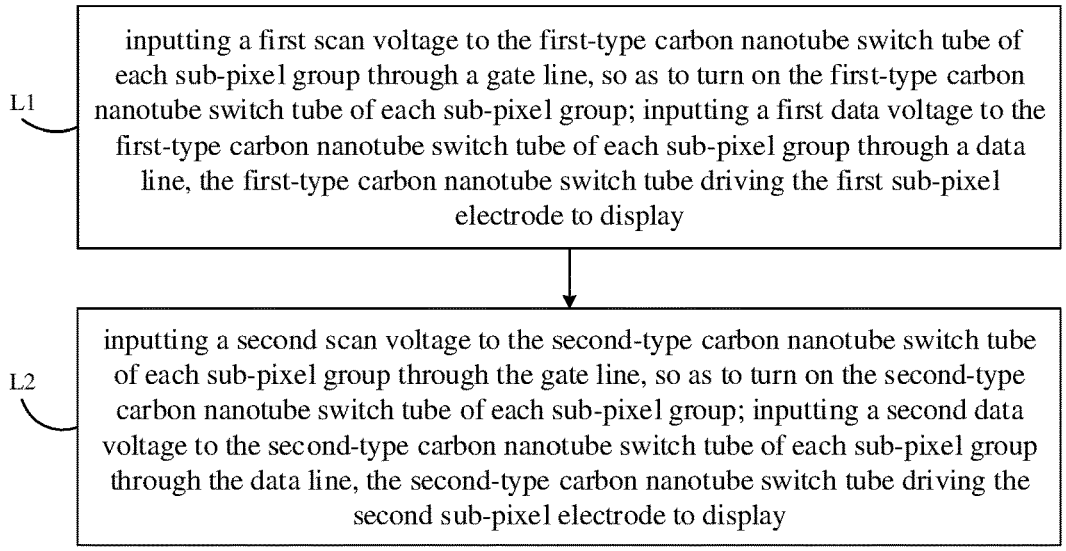
Fig. 3B
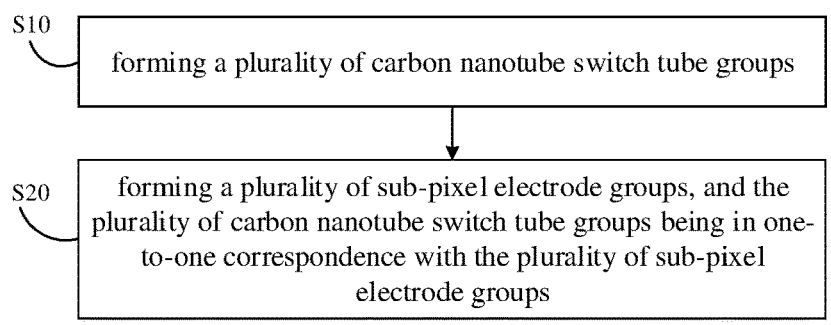
Fig. 4
Fig. 5

| P11 − | P12 + | P13 − | P14 + | P15 − | P16 + |
|---|---|---|---|---|---|
| P21 + | P22 − | P23 + | P24 − | P25 + | P26 − |
| P31 − | P32 + | P33 − | P34 + | P35 − | P36 + |

PIXEL STRUCTURE, DRIVING METHOD THEREFOR AND PREPARATION METHOD THEREFOR, AND DISPLAY APPARATUS

CROSS-REFERENCE TO RELATED APPLICATION

The present application claims priority of the Chinese Patent Application No. 201710413271.3, filed on Jun. 5, 2017, the disclosure of which is incorporated herein by reference in its entirety as part of the present application.

TECHNICAL FIELD

The embodiments of the present disclosure relate to a pixel structure, a method of driving a pixel structure, a method of manufacturing a pixel structure, and a display device.

BACKGROUND

Currently, in order to improve display effect of a display device, the display device adopts a dual-gate drive mode, and in order to achieve the dual-gate drive mode, the number of gate lines in the display device needs to be doubled, meanwhile the number of data lines is halved, so the manufacture and operation costs of pixel structures in the display device are relatively high.

Therefore, how to achieve a dual-gate driving effect of a display device without increasing the manufacture and operation costs of pixel structures has become an urgent technical problem to be solved at present.

SUMMARY

At least one embodiment of the present disclosure provides a pixel structure comprising a plurality of sub-pixel groups arranged in an array, each sub-pixel group of the plurality of sub-pixel groups comprises a first sub-pixel electrode, a second sub-pixel electrode, a first-type carbon nanotube switch tube and a second-type carbon nanotube switch tube, the first sub-pixel electrode is connected to the first-type carbon nanotube switch tube, the second sub-pixel electrode is connected to the second-type carbon nanotube switch tube, and the first-type carbon nanotube switch tube and the second-type carbon nanotube switch tube in each sub-pixel group are connected to a same gate line and a same data line.

For example, in the pixel structure provided by an embodiment of the present disclosure, the first sub-pixel electrode and the second sub-pixel electrode in each sub-pixel group are adjacent.

For example, in the pixel structure provided by an embodiment of the present disclosure, the first sub-pixel electrode and the second sub-pixel in each sub-pixel group are located in a same row.

For example, in the pixel structure provided by an embodiment of the present disclosure, in a same column of sub-pixel electrodes, the first sub-pixel electrode and the second sub-pixel electrode are alternately arranged.

For example, in the pixel structure provided by an embodiment of the present disclosure, in an odd row of the plurality of sub-pixel groups, the first sub-pixel electrode is located in an odd column, and the second sub-pixel electrode is located in an even column; in an even row of the plurality of sub-pixel groups, the second sub-pixel electrode is located in an odd column, and the first sub-pixel electrode is located in an even column.

For example, in the pixel structure provided by an embodiment of the present disclosure, in an odd row of the plurality of sub-pixel groups, the second sub-pixel electrode is located in an odd column, and the first sub-pixel electrode is located in an even column; in an even row of the plurality of sub-pixel groups, the first sub-pixel electrode is located in an odd column, and the second sub-pixel electrode is located in an even column.

For example, in the pixel structure provided by an embodiment of the present disclosure, in each sub-pixel group, the first-type carbon nanotube switch tube connected to the first sub-pixel electrode and the second-type carbon nanotube switch tube connected to the second sub-pixel electrode are respectively located at two sides of a data line that is connected to both the first-type carbon nanotube switch tube and the second-type carbon nanotube switch tube.

For example, in the pixel structure provided by an embodiment of the present disclosure, in each sub-pixel group, the second-type carbon nanotube switch tube and the first-type carbon nanotube switch tube are mirror-symmetrical with the data line as a symmetry axis.

For example, in the pixel structure provided by an embodiment of the present disclosure, first-type carbon nanotube switch tubes and second-type carbon nanotube switch tubes in sub-pixel groups located in a same row are connected to a same corresponding gate line, and first-type carbon nanotube switch tubes and second-type carbon nanotube switch tubes in sub-pixel groups located in a same column are connected to a same corresponding date line.

For example, in the pixel structure provided by an embodiment of the present disclosure, the first-type carbon nanotube switch tube is an N-type carbon nanotube switch tube, and the second-type carbon nanotube switch tube is a P-type carbon nanotube switch tube; or, the first-type carbon nanotube switch tube is a P-type carbon nanotube switch tube, and the second-type carbon nanotube switch tube is an N-type carbon nanotube switch tube.

For example, in the pixel structure provided by an embodiment of the present disclosure, a material of a source electrode and a drain electrode of the N-type carbon nanotube switch tube is copper or aluminum, and a material of a source electrode and a drain electrode of the P-type carbon nanotube switch tube is lead.

At least one embodiment of the present disclosure further provides a manufacture method of a pixel structure according to any one of the above embodiments, comprising: forming the plurality of sub-pixel groups arranged in an array, where each sub-pixel group of the plurality of sub-pixel groups comprises a first sub-pixel electrode, a second sub-pixel electrode, a first-type carbon nanotube switch tube and a second-type carbon nanotube switch tube, the first sub-pixel electrode is connected to the first-type carbon nanotube switch tube, the second sub-pixel electrode is connected to the second-type carbon nanotube switch tube, and an active layer of the first-type carbon nanotube switch tube and an active layer of the second-type carbon nanotube switch tube are simultaneously formed.

At least one embodiment of the present disclosure further provides a driving method of a pixel structure according to any one of the above embodiments, driving of each sub-pixel group comprises a positive driving phase and a negative driving phase;

in the positive driving phase, inputting a first scan voltage to the first-type carbon nanotube switch tube of each sub-pixel group through a gate line, so as to turn on the first-type carbon nanotube switch tube; inputting a first data voltage to the first-type carbon nanotube switch tube through a data line, the first-type carbon nanotube switch tube driving the first sub-pixel electrode to display;

in the negative driving phase, inputting a second scan voltage to the second-type carbon nanotube switch tube of each sub-pixel group through the gate line, so as to turn on the second-type carbon nanotube switch tube; inputting a second data voltage to the second-type carbon nanotube switch tube through the data line, the second-type carbon nanotube switch tube driving the second sub-pixel electrode to display; a polarity of the first data voltage and a polarity of the second data voltage are opposite.

For example, in the driving method of the pixel structure provided by an embodiment of the present disclosure, in an Nth frame, the polarity of the first data voltage is positive, and the polarity of the second data voltage is negative; in a (N+1)th frame, the polarity of the first data voltage is negative, and the polarity of the second data voltage is positive, N is a positive integer.

For example, in the driving method of the pixel structure provided by an embodiment of the present disclosure, first sub-pixel electrodes in sub-pixel groups located in an odd row and first sub-pixel electrodes in sub-pixel group located in an even row are driven in the positive driving phase; and second sub-pixel electrodes in the sub-pixel groups located in the odd row and second sub-pixel electrodes in the sub-pixel group located in the even row are driven in the negative driving phase.

For example, in the driving method of the pixel structure provided by an embodiment of the present disclosure, second sub-pixel electrodes in sub-pixel groups located in an odd row and second sub-pixel electrodes in sub-pixel group located in an even row are driven in the positive driving phase; and first sub-pixel electrodes in the sub-pixel groups located in the odd row and first sub-pixel electrodes in the sub-pixel group located in the even row are driven in the negative driving phase.

At least one embodiment of the present disclosure further provides a display device, comprising the pixel structure of any of the above embodiments.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

FIG. 3B is a schematic diagram showing polarities of sub-pixels in a pixel structure according to an embodiment of the present disclosure in adjacent two frames;

FIG. 4 is a flowchart of a driving method of a pixel structure according to an embodiment of the present disclosure;

FIG. 5 is a flowchart of a manufacture method of a pixel structure according to an embodiment of the present disclosure;

REFERENCE NUMBER

Figures 1, 2:
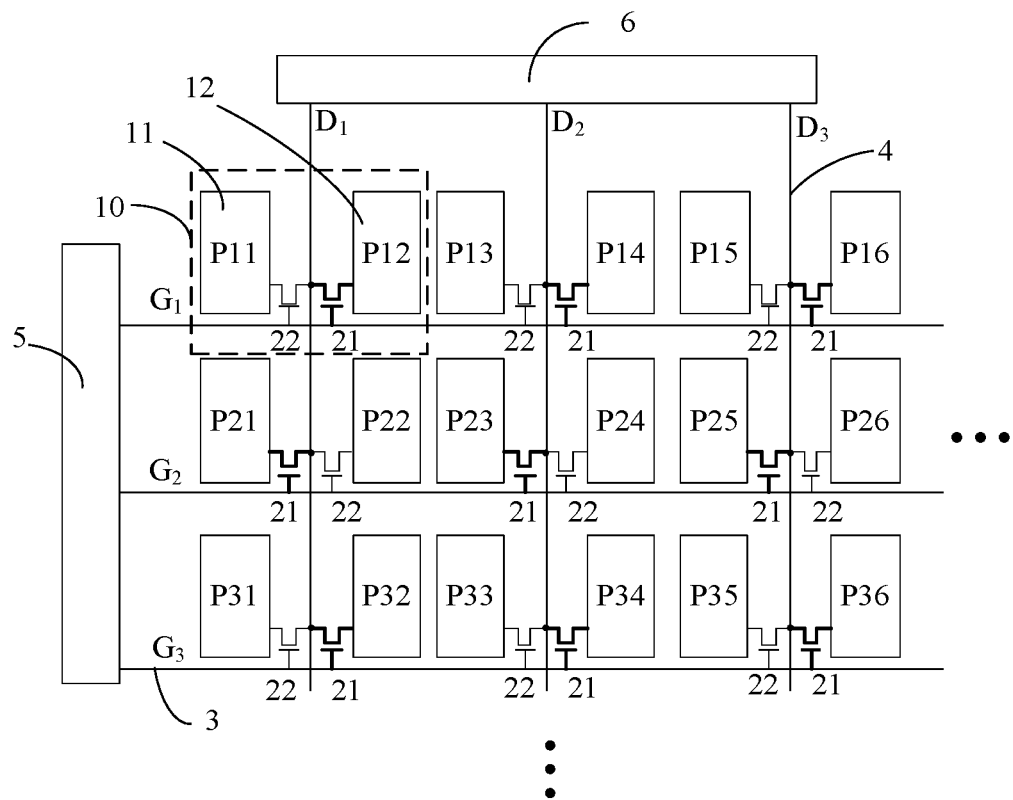
FIG. 1 is a schematic structural diagram of a pixel structure according to an embodiment of the present disclosure.
FIG. 2 is a schematic diagram of the pixel structure illustrated in FIG. 1 implementing dot inversion driving in a column-driving mode.

10—sub-pixel group; 11—first sub-pixel electrode; 12—second sub-pixel electrode; 21—second-type carbon nanotube switch tube; 22—first-type carbon nanotube switch tube; 3—gate line; 4—data line; 5—gate line driving circuit; 6—data line driving circuit; L1—positive driving phase; L2—negative driving phase.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

At least one embodiment of the present disclosure provides a pixel structure, a method of driving the pixel structure, a method of manufacturing the pixel structure, and a display device. The pixel structure comprises a plurality of sub-pixel groups arranged in an array; each sub-pixel group of the plurality of sub-pixel groups comprises a first sub-pixel electrode, a second sub-pixel electrode, a first-type carbon nanotube switch tube and a second-type carbon nanotube switch tube; the first sub-pixel electrode is connected to the first-type carbon nanotube switch tube, the second sub-pixel electrode is connected to the second-type carbon nanotube switch tube, and the first-type carbon nanotube switch tube and the second-type carbon nanotube switch tube in each sub-pixel group are connected to a same gate line and a same data line.

The beneficial effects of the present disclosure include at least:

The pixel structure is capable of achieving the driving operation of the pixel structure in a case where sub-pixel groups in each row is connected to one gate line and sub-pixel groups in each column is connected to one data line; compared with an existing pixel structure, the pixel structure can reduce the number of gate lines by half without increasing the number of data lines, thereby reducing the preparation and operation costs of the pixel structure; in addition, the pixel structure can implement the driving effect of dot inversion in the column-driving mode, thus improving the display effect of the display device adopting the pixel structure; meanwhile, in the pixel structure provided by the embodiments of the present disclosure, the materials of the source electrode and the drain electrode of the P-type carbon nanotube switch tube are different from the materials of the source electrode and the drain electrode of the N-type carbon nanotube switch tube, so the doping process is not required, and the P-type carbon nanotube switch tube and the N-type carbon nanotube switch tube can be manufactured by a sample patterning process, and therefore the preparation process of the P-type carbon nanotube switch tube and the N-type carbon nanotube switch tube becomes simpler, thereby reducing the preparation cost of the pixel structure and improving the preparation efficiency of the pixel structure.

The display device provided by the present disclosure adopts the above pixel structure, thus reducing the preparation and operation costs of the display device, improving the display effect of the display device, meanwhile simplifying the preparation complexity of the display device, and improving the preparation efficiency of the display device.

In order to enable those skilled in the art to better understand the technical solutions of the present disclosure, the pixel structure, the driving method of the pixel structure, the manufacturing method of the pixel structure and the display device provided by the present disclosure are described in detail below with reference to the accompanying drawing and some specific embodiments.

The embodiments of the present disclosure provide a pixel structure. FIG. 1 is a schematic structural diagram of a pixel structure according to an embodiment of the present disclosure. FIG. 2 is a schematic diagram of the pixel structure illustrated in FIG. 1 implementing dot inversion driving in a column-driving mode.

For example, as illustrated in FIG. 1, the pixel structure comprises a plurality of sub-pixel groups 10 arranged in an array. Each sub-pixel group 10 of the plurality of sub-pixel groups 10 comprises a first sub-pixel electrode 11, a second sub-pixel electrode 12, a first-type carbon nanotube switch tube 22 and a second-type carbon nanotube switch tube 21; the first sub-pixel electrode 11 is connected to the first-type carbon nanotube switch tube 22, the second sub-pixel electrode 12 is connected to the second-type carbon nanotube switch tube 21, and the first-type carbon nanotube switch tube 22 and the second-type carbon nanotube switch tube 21 in each sub-pixel group 10 are connected to the same single gate line 3 and the same single data line 4.

For example, a channel material of the second-type carbon nanotube switch tube 21 and a channel material of the first-type carbon nanotube switch tube 22 are both carbon nanotubes. The carbon nanotubes may be formed of random reticular single-walled carbon nanotubes in a network structure. The carbon nanotubes can be directly formed on an insulating layer by a chemical vapor deposition (CVD) method.

For example, a material of a source electrode and a drain electrode of the second-type carbon nanotube switch tube 21 is different from a material of a source electrode and a drain electrode of the first-type carbon nanotube switch tube 22.

For example, the first-type carbon nanotube switch tube 22 is an N-type carbon nanotube switch tube, and the second-type carbon nanotube switch tube 21 is a P-type carbon nanotube switch tube; or, the first-type carbon nanotube switch tube 22 is a P-type carbon nanotube switch tube, and the second-type carbon nanotube switch tube 21 is an N-type carbon nanotube switch tube. The material of the source electrode and the drain electrode of the N-type carbon nanotube switch tube may be copper or aluminum, or the like, and the material of the source electrode and the drain electrode of the P-type carbon nanotube switch tube may be lead, or the like. In the present disclosure, the embodiments of the present disclosure are described by taking a case in which the first-type carbon nanotube switch tube 22 is an N-type carbon nanotube switch tube and the second-type carbon nanotube switch tube 21 is a P-type carbon nanotube switch tube as an example.

For example, there is no shared sub-pixel(s) between adjacent two sub-pixel groups 10. It should be noted that, "adjacent two sub-pixel groups 10" may indicates that the two sub-pixel groups 10 are physically adjacent, and no other sub-pixel group(s) exists between the two sub-pixel groups 10.

For example, as illustrated in FIG. 1, the first sub-pixel electrode 11 and the second sub-pixel electrode 12 in each sub-pixel group 10 are located in the same row.

For example, in the embodiments of the present disclosure, the first sub-pixel electrode 11 and the second sub-pixel electrode 12 in each sub-pixel group are adjacent. First-type carbon nanotube switch tubes 22 and second-type carbon nanotube switch tubes 21 in sub-pixel groups 10 located in the same row are connected to the same one gate line 3, first-type carbon nanotube switch tubes 22 and second-type carbon nanotube switch tubes 21 in sub-pixel groups 10 located in the same column are connected to the same one data line 4. It should be noted that P11 to P16 in FIG. 1 indicate sub-pixel electrodes located in a first row, P21 to P26 indicate sub-pixel electrodes located in a second row, P31 to P36 indicate sub-pixel electrodes located in a third row. P11, P21 and P31 denote sub-pixel electrodes located in a first column, P12, P22 and P32 denote sub-pixel electrodes located in a second column, and so on. For example, each column of sub-pixel groups comprises two sub-pixel electrode columns, and a first column of sub-pixel electrodes (that is, P11, P21 and P31) and a second column of sub-pixel electrodes (that is, P12, P22 and P32) may, for example, constitute one column of sub-pixel groups. In FIG. 1, P11, P13, P15, P22, P24, P26, P31, P33, P35 all are the first sub-pixel electrodes 11, and P12, P14, P16, P21, P23, P25, P32, P34, P36 all are the second sub-pixel electrodes 12.

It should be noted that, in the present disclosure, "the first sub-pixel electrode 11 and the second sub-pixel electrode 12 are adjacent" does not indicate that a physical position of the first sub-pixel electrode 11 and a physical position of the second sub-pixel electrode 12 are directly adjacent in the row direction, but indicates that no other sub-pixel electrodes exist between the first sub-pixel electrode 11 and the second sub-pixel electrode 12 in the row direction.

For example, as illustrated in FIG. 1, in a same column of sub-pixel electrodes, the first sub-pixel electrode 11 and the second sub-pixel electrode 12 are alternately arranged. As illustrated in FIG. 1, in a case where a sub-pixel electrode P11 is the first sub-pixel electrode 11, then a sub-pixel electrode P21 is the second sub-pixel electrode 12, and a sub-pixel electrode P31 is the first sub-pixel electrode 11.

In an existing dual-gate driving pixel structure, pixel electrodes of respective sub-pixels all are connected to N-type thin film transistors, and in a case where the number of data lines is halved, each row of sub-pixels needs to be connected with two gate lines to achieve the driving of the row of sub-pixels. In the above-mentioned pixel structure provided by the embodiments of the present disclosure, compared with the existing dual-gate driving pixel structure, the first sub-pixel electrode 11 in the sub-pixel group 10 is connected to the first-type carbon nanotube switch tube 22, and the second sub-pixel electrode 12 in the sub-pixel group 10 is connected to the second-type carbon nanotube switch tube 21, the driving of the pixel structure can be achieved in a case where sub-pixel groups 10 in each row are connected to the same gate line 3 and sub-pixel groups 10 in each column are connected to the same data line 4, so that in the pixel structure, the number of gate lines can be reduced by half without increasing the number of the data lines, furthermore reducing the preparation and operation costs of the pixel structure; meanwhile, the pixel structure can be normally displayed under the driving of the carbon nanotube switch tubes.

For example, as illustrated in FIG. 1, first-type carbon nanotube switch tubes 22 and second-type carbon nanotube switch tubes 21 in sub-pixel groups 10 located in a same row are connected to a same corresponding gate line 3, and first-type carbon nanotube switch tubes 22 and second-type carbon nanotube switch tubes 21 in sub-pixel groups 10 located in a same column are connected to a same corresponding date line 4.

It should be noted that, in the present disclosure, a first sub-pixel electrode 11 represents a sub-pixel electrode connected to the first-type carbon nanotube switch tube 22 (such as, an N-type carbon nanotube switch tube), and a second sub-pixel electrode 12 represents a sub-pixel electrode connected to the second-type carbon nanotube switch tube 21 (such as, an P-type carbon nanotube switch tube).

For example, as illustrated in FIG. 1, a data line 4 is located between the first sub-pixel electrode 11 and the second sub-pixel electrode 12 of a corresponding sub-pixel group 10. A data line 4 is not disposed between adjacent two sub-pixel groups 10.

It should be noted that, in the above descriptions of the present disclosure, each sub-pixel group 10 includes two sub-pixel electrodes, but the present disclosure is not limited to this case, each sub-pixel group 10 may also include a plurality of (such as, four) sub-pixel electrodes and a plurality of carbon nanotube switch tubes (such as, four carbon nanotube switch tubes, and the four carbon nanotube switch tubes are respectively two first-type carbon nanotube switch tubes and two second-type carbon nanotube switch tubes), and the carbon nanotube switch tubes are in one-to-one correspondence with the plurality of sub-pixel electrodes, and the plurality of sub-pixel electrodes, for example, may be arranged in several rows and two columns.

For example, in some embodiments of the present disclosure, as illustrated in FIG. 1, in an odd row of the sub-pixel groups 10, the first sub-pixel electrode 11 is located in an odd column, and the second sub-pixel electrode 12 is located in an even column; in an even row of the sub-pixel groups 10, the second sub-pixel electrode 12 is located in an odd column, and the first sub-pixel electrode 11 is located in an even column.

The first-type carbon nanotube switch tube 22 (i.e., the N-type carbon nanotube switch tube) is turned on when a high level signal is input to a gate electrode thereof, and is turned off when a low level signal is input to the gate electrode thereof; the second-type carbon nanotube switch tube 21 (i.e., the P-type carbon nanotube switch tube) is turned on when a low level signal is input to a gate electrode thereof, and is turned off when a high level signal is input to the gate electrode thereof. For example, as illustrated in FIG. 1 and FIG. 2, when a scan voltage of a high level is input to the gate line 3 correspondingly connected to the sub-pixel groups 10 located in the odd row, the first-type carbon nanotube switch tubes 22 in the sub-pixel groups 10 located in the odd row are turned on, at this time, a positive data voltage higher than a common voltage is input to the data line 4, the first sub-pixel electrodes 11 (such as, the sub-pixel electrode P11) in the sub-pixel groups 10 located in the odd row work to display under the driving of the first-type carbon nanotube switch tubes 22; when a scan voltage of a low level is input to the gate line 3 correspondingly connected to the sub-pixel groups 10 located in the odd row, the second-type carbon nanotube switch tubes 21 in the sub-pixel groups 10 located in the odd row are turned on, at this time, a negative data voltage lower than the common voltage is input to the data line 4, the second sub-pixel electrodes 12 (such as, the sub-pixel electrode P12) in the sub-pixel groups 10 located in the odd row work to display under the driving of the second-type carbon nanotube switch tubes 21.

Correspondingly, as illustrated in FIG. 1 and FIG. 2, when a scan voltage of a high level is input to the gate line 3 correspondingly connected to the sub-pixel groups 10 located in the even row, the first-type carbon nanotube switch tubes 22 in the sub-pixel groups 10 located in the even row are turned on, at this time, a positive data voltage higher than the common voltage is input to the data line 4, the first sub-pixel electrodes 11 (such as, the sub-pixel electrode P22) in the sub-pixel groups 10 located in the even row work to display under the driving of the first-type carbon nanotube switch tubes 22; when a scan voltage of a low level is input to the gate line 3 correspondingly connected to the sub-pixel groups 10 located in the even row, the second-type carbon nanotube switch tubes 21 in the sub-pixel groups 10 located in the even row are turned on, at this time, a negative data voltage lower than the common voltage is input to the data line 4, the second sub-pixel electrodes 12 (such as, the sub-pixel electrode P21) in the sub-pixel groups 10 located in the even row work to display under the driving of the second-type carbon nanotube switch tubes 21. As illustrated in FIG. 2, in each frame, a polarity of a data voltage on the first sub-pixel electrode 11 in each sub-pixel group 10 is opposite to a polarity of a data voltage on the second sub-pixel electrode 12 in each sub-pixel group 10. Therefore, the pixel structure achieves the dot inversion driving effect in the column-driving mode, thereby improving the display effect of the display device having the pixel structure.

For example, in the embodiments of the present disclosure, in each sub-pixel group 10, the first-type carbon nanotube switch tube 22 connected to the first sub-pixel electrode 11 and the second-type carbon nanotube switch tube 21 connected to the second sub-pixel electrode 12 are respectively located at two sides of a corresponding data line 4 that is connected to both the first-type carbon nanotube switch tube 22 and the second-type carbon nanotube switch tube 21.

For example, in each sub-pixel group 10, the second-type carbon nanotube switch tube 21 and the first-type carbon nanotube switch tube 22 are mirror-symmetrical with the corresponding data line 4 connected to both of them as a symmetry axis, and the first sub-pixel electrode 11 and the second sub-pixel electrode 12 are also mirror-symmetrical with the corresponding data line 4 as a symmetry axis. Thus, the second-type carbon nanotube switch tube 21 and the first-type carbon nanotube switch tube 22 in the pixel structure can be connected to the corresponding gate line 3 via a relatively short distance and to the corresponding data line 4 via a relatively short distance as well, so that the wiring distance of the pixel structure can be shortened, which not only reduces the cost of the wiring, but also makes the line layout of the pixel structure simpler, and furthermore the design and manufacture costs of the pixel structure are reduced.

For example, in the embodiments of the present disclosure, as illustrated in FIG. 1, the pixel structure further comprises a gate line driving circuit 5 and a data line driving circuit 6. The gate line driving circuit 5 is connected to each of the gate lines 3 and is used for inputting a scan voltage to each of the gate lines 3, to turn on the corresponding carbon nanotube switch tubes. The data line driving circuit 6 is connected to each of the data lines 4 and is used for providing a data voltage to each of the data lines 4, to make the corresponding sub-pixel electrodes display an image.

Figure 3A:
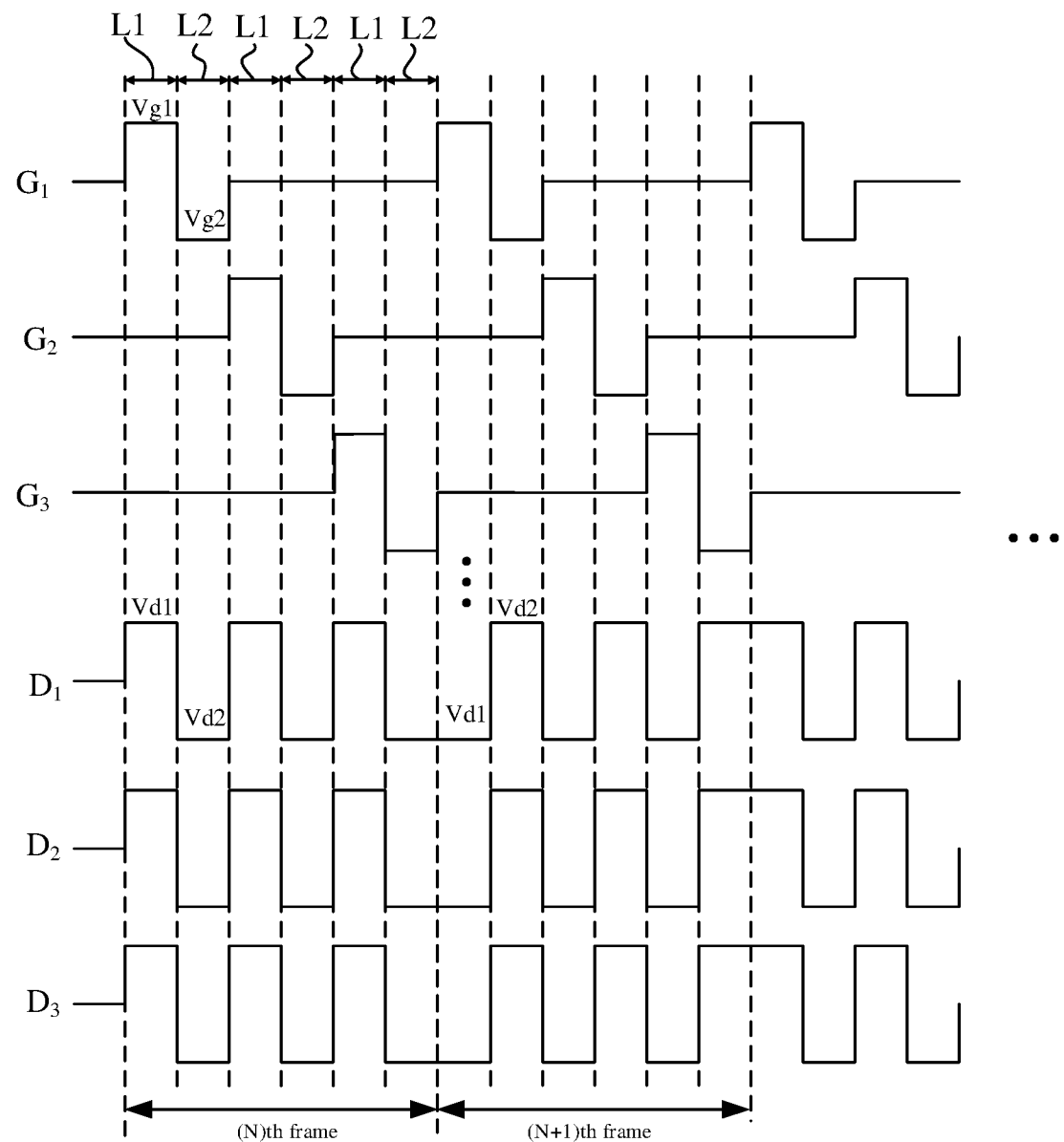
FIG. 3A is a driving timing diagram of a pixel structure according to an embodiment of the present disclosure.

At least one embodiment of the present disclosure further provides a driving method of a pixel structure. FIG. 3A is a driving timing diagram of a pixel structure according to an embodiment of the present disclosure; FIG. 3B is a schematic diagram showing polarities of sub-pixels in a pixel structure according to an embodiment of the present disclosure in adjacent two frames; FIG. 4 is a flowchart of a driving method of a pixel structure according to an embodiment of the present disclosure.

For example, as illustrated in FIG. 4, the driving operation of each sub-pixel group comprises a positive driving phase L1 and a negative driving phase L2. The driving method of the pixel structure comprises:

in the positive driving phase L1, inputting a first scan voltage to the first-type carbon nanotube switch tube of each sub-pixel group through a gate line, so as to turn on the first-type carbon nanotube switch tube of each sub-pixel group; inputting a first data voltage to the first-type carbon nanotube switch tube of each sub-pixel group through a data line, the first-type carbon nanotube switch tube driving the first sub-pixel electrode to display; and in the negative driving phase L2, inputting a second scan voltage to the second-type carbon nanotube switch tube of each sub-pixel group through the gate line, so as to turn on the second-type carbon nanotube switch tube of each sub-pixel group; inputting a second data voltage to the second-type carbon nanotube switch tube of each sub-pixel group through the data line, the second-type carbon nanotube switch tube driving the second sub-pixel electrode to display.

For example, a polarity of the first data voltage and a polarity of the second data voltage are opposite to each other.

For example, the first scan voltage may be a positive scan voltage, and correspondingly, the second scan voltage may be a negative scan voltage.

For example, as illustrated in FIG. 1, a gate line $G_1$ is connected to respective sub-pixel electrodes (i.e., the sub-pixel electrodes P11 to P16) in a first row of sub-pixel groups, a gate line $G_2$ is connected to respective sub-pixel electrodes (i.e., the sub-pixel electrodes P21 to P26) in a second row of sub-pixel groups, and a gate line $G_3$ is connected to respective sub-pixel electrodes (i.e., the sub-pixel electrodes P31 to P36) in a third row of sub-pixel groups. A data line $D_1$ is connected to respective sub-pixel electrodes (i.e., the sub-pixel electrodes P11, P12, P21, P22, P31, P32) in a first column of sub-pixel groups, a data line $D_2$ is connected to respective sub-pixel electrodes (i.e., the sub-pixel electrodes P13, P14, P23, P24, P33, P34) in a second column of sub-pixel groups, and a data line $D_3$ is connected to respective sub-pixel electrodes (i.e., the sub-pixel electrodes P15, P16, P25, P26, P35, P36) in a third column of sub-pixel groups.

For example, as illustrated in FIG. 1 and FIG. 3A, for the first sub-pixel electrode 11 (for example, the sub-pixel electrode P11, which is represented as the first sub-pixel electrode P11 hereinafter), in the positive driving phase L1, the gate line $G_1$ transmits the first scan voltage Vg1 to the first-type carbon nanotube switch tube 22 connected to the first sub-pixel electrode P11 in the sub-pixel group 10, so that the first-type carbon nanotube switch tube 22 connected to the first sub-pixel electrode P11 is turned on; meanwhile, the data line $D_1$ inputs the first data voltage Vd1 to the first-type carbon nanotube switch tube 22 connected to the first sub-pixel electrode P11, thereby driving the first sub-pixel electrode P11 for displaying.

For example, for the second sub-pixel electrode 12 (for example, the sub-pixel electrode P12, which is represented as the second sub-pixel electrode P12 hereinafter), in the negative driving phase L2, the gate line $G_1$ transmits the second scan voltage Vg2 to the second-type carbon nanotube switch tube 21 connected to the second sub-pixel electrode P12 in the sub-pixel group 10, so that the second-type carbon nanotube switch tube 21 connected to the second sub-pixel electrode P12 is turned on; meanwhile, the data line $D_1$ inputs the second data voltage Vd2 to the second-type carbon nanotube switch tube 21 connected to the second sub-pixel electrode P12, thereby driving the second sub-pixel electrode P12 for displaying.

It should be noted that, the driving processes of the remaining sub-pixel electrodes are similar to those of the first sub-pixel electrode P11 and the second sub-pixel electrode P12, and the redundant descriptions will be omitted here.

For example, the first data voltage and the second data voltage transmitted on each data line (for example, the data line $D_1$, the data line $D_2$ and the data line $D_3$) may be determined according to actual conditions, and the present disclosure is not limited thereto.

For example, in the adjacent two frames, the polarities of the first data voltages Vd1 are opposite, and the polarities of the second data voltages Vd2 are also opposite. As illustrated in FIG. 3A and FIG. 3B, in an (N)th frame, the polarity of the first data voltage Vd1 is positive, and the polarity of the second data voltage Vd2 is negative, so that the data voltage on the first sub-pixel electrode P11 is positive, and the data voltage on the second sub-pixel electrode P12 is negative; in an (N+1)th frame, the polarity of the first data voltage Vd1 is negative, and the polarity of the second data voltage Vd2 is positive, so that the data voltage on the first sub-pixel electrode P11 is negative, and the data voltage on the second sub-pixel electrode P12 is positive. N is a positive integer.

For example, first sub-pixel electrodes in sub-pixel groups located in an odd row and first sub-pixel electrodes in sub-pixel group located in an even row are driven in the positive driving phase; and second sub-pixel electrodes in the sub-pixel groups located in the odd row and second sub-pixel electrodes in the sub-pixel group located in the even row are driven in the negative driving phase.

For example, as illustrated in FIG. 1, in the first row of sub-pixel groups, the sub-pixel electrode P11, the sub-pixel electrode P13, the sub-pixel electrode P15 all are the first sub-pixel electrodes 11; the sub-pixel electrode P12, the sub-pixel electrode P14, the sub-pixel electrode P16 all are the second sub-pixel electrodes 12; in the second row of sub-pixel groups, the sub-pixel electrode P22, the sub-pixel electrode P24, the sub-pixel electrode P26 all are the first sub-pixel electrodes 11; the sub-pixel electrode P21, the sub-pixel electrode P23, the sub-pixel electrode P25 all are the second sub-pixel electrodes 12. The sub-pixel electrode P11, the sub-pixel electrode P13 and the sub-pixel electrode P15 that are located in the first row of sub-pixel groups and the sub-pixel electrode P22, the sub-pixel electrode P24 and the sub-pixel electrode P26 that are located in the second row of sub-pixel groups are all driven in the positive driving phase; and the sub-pixel electrode P12, the sub-pixel electrode P14 and the sub-pixel electrode P16 that are located in the first row of sub-pixel groups and the sub-pixel electrode P21, the sub-pixel electrode P23 and the sub-pixel electrode P25 that are located in the second row of sub-pixel groups are all driven in the negative driving phase.

From the above, when the scan voltage of a high level is input to the gate line 3 correspondingly connected to the sub-pixel groups located in the odd row, the first-type carbon nanotube switch tubes in the sub-pixel groups 10 located in the odd row are turned on, at this time, a positive data voltage higher than a common voltage is input to the data line 4, the first sub-pixel electrodes in the sub-pixel groups 10 located in the odd row work to display under the driving of the first-type carbon nanotube switch tubes; when a scan voltage of a low level is input to the gate line 3 correspondingly connected to the sub-pixel groups 10 located in the odd row, the second-type carbon nanotube switch tubes in the sub-pixel groups 10 located in the odd row are turned on, at this time, a negative data voltage lower than the common voltage is input to the data line 4, the second sub-pixel electrodes in the sub-pixel groups 10 located in the odd row work to display under the driving of the second-type carbon nanotube switch tubes. Correspondingly, when a scan voltage of a high level is input to the gate line 3 correspondingly connected to the sub-pixel groups 10 located in the even row, the first-type carbon nanotube switch tubes in the sub-pixel groups 10 located in the even row are turned on, at this time, a positive data voltage higher than the common voltage is input to the data line 4, the first sub-pixel electrodes in the sub-pixel groups 10 located in the even row work to display under the driving of the first-type carbon nanotube switch tubes; when a scan voltage of a low level is input to the gate line 3 correspondingly connected to the sub-pixel groups 10 located in the even row, the second-type carbon nanotube switch tubes in the sub-pixel groups 10 located in the even row are turned on, at this time, a negative data voltage lower than the common voltage is input to the data line 4, the second sub-pixel electrodes 12 in the sub-pixel groups 10 located in the even row work to display under the driving of the second-type carbon nanotube switch tubes. Therefore, the pixel structure achieves the dot inversion driving effect in the column-driving mode, thereby improving the display effect of the display device having the pixel structure.

At least one embodiment of the present disclosure further provides a manufacture method of a pixel structure. FIG. 5 is a flowchart of a manufacture method of a pixel structure according to an embodiment of the present disclosure. For example, the manufacture method of the pixel structure may include a following step: forming a plurality of sub-pixel groups arranged in an array.

For example, as illustrated in FIG. 5, forming the plurality of sub-pixel groups arranged in an array may include:

S10: forming a plurality of carbon nanotube switch tube groups; and

S20: forming a plurality of sub-pixel electrode groups, the plurality of carbon nanotube switch tube groups being in one-to-one correspondence with the plurality of sub-pixel electrode groups.

For example, each sub-pixel group comprises a sub-pixel electrode group and a carbon nanotube switch tube group, each sub-pixel electrode group comprises a first sub-pixel electrode and a second sub-pixel electrode, and each carbon nanotube switch tube group comprises a first-type carbon nanotube switch tube and a second-type carbon nanotube switch tube. The first sub-pixel electrode is connected to the first-type carbon nanotube switch tube, the second sub-pixel electrode is connected to the second-type carbon nanotube switch tube, an active layer of the first-type carbon nanotube switch tube connected to the first sub-pixel electrode and an active layer of the second-type carbon nanotube switch tube connected to the second sub-pixel electrode are simultaneously formed. The source electrode and the drain electrode of the second-type carbon nanotube switch tube and the source electrode and the drain electrode of the first-type carbon nanotube switch tube are respectively formed by different materials.

For example, the source electrode and the drain electrode of the second-type carbon nanotube switch tube are formed by the same material; and the source electrode and the drain electrode of the first-type carbon nanotube switch tube are formed by the same material.

For example, the active layer of the first-type carbon nanotube switch tube and the active layer of the second-type carbon nanotube switch tube are simultaneously formed by using the same carbon nanotube material. The carbon nanotube material can be used not only as a channel material for a P-type transistor, but also as a channel material for an N-type transistor.

For example, the source electrode and the drain electrode of the N-type carbon nanotube switch tube are formed by using, for example, copper (Cu) or aluminum (Al), and the source electrode and the drain electrode of the P-type carbon nanotube switch tube are formed by using, for example, lead (Pb). For example, the first-type carbon nanotube switch tube is an N-type carbon nanotube switch tube, the second-type carbon nanotube switch tube is a P-type carbon nanotube switch tube, that is, the source electrode and the drain electrode of the first-type carbon nanotube switch tube are formed by using copper (Cu) or aluminum (Al), and the source electrode and the drain electrode of the second-type carbon nanotube switch tube are formed by using lead (Pb).

An existing P-type transistor and an existing N-type transistor may be a-Si transistors, oxide transistors or low temperature polysilicon transistors. For a-Si transistors and oxide transistors, a doping process is required to simultaneously prepare a P-type transistor and an N-type transistor, and for low temperature polysilicon transistors, a doping process is also required to simultaneously prepare a P-type transistor and an N-type transistor, the preparation of the P-type transistor and the N-type transistor by the doping process requires ion diffusion or ion implantation, the preparation process is cumbersome and complicated, and the number of masks is large, and therefore, the preparation costs of the P-type transistor and the N-type transistor are relatively high. In the manufacture method of the pixel structure provided in the embodiments of the present disclosure, the active layer of the carbon nanotube switch tube is formed by using a carbon nanotube material, and the source-drain electrodes of the carbon nanotube switch tubes are formed by using different materials, thereby forming the first-type carbon nanotube switch tube (such as, the N-type carbon nanotube switch tube) and the second-type carbon nanotube switch tube (such as, the P-type carbon nanotube switch tube) respectively. The first-type carbon nanotube switch tube and the second-type carbon nanotube switch tube can be formed respectively by a patterning process. Compared with the existing a-Si transistors, oxide transistors and low temperature polysilicon transistors, the first-type carbon nanotube switch tube and the second-type carbon nanotube switch tube are formed without using a doping process, so the preparation processes of the first-type carbon nanotube switch tube and the second-type carbon nanotube switch tube are simpler, thereby reducing the preparation cost of the pixel structure and improving the preparation efficiency of the pixel structure.

For example, in some embodiments, the manufacture method of the pixel structure specifically comprises the following operations.

(1) Cleaning a glass substrate through a standard method.

(2) Depositing a first metal layer by a sputtering process, in which for example, a thickness of the first metal layer may be 2200 nm, and a material of the first metal layer may be molybdenum (Mo).

(3) Performing a photolithography process and a developing process on the first metal layer to form a gate region; and then performing a wet etching process to form a gate layer of a switch tube. Gate lines may also be formed simultaneously in this step (3).

(4) Depositing an insulating layer by plasma enhanced chemical vapor deposition (PECVD) to form a gate insulating layer of the switch tube. A thickness of the insulating layer is 100-200 nm, and a material of the insulating layer may be silicon oxide (SiOx) or silicon nitride (SiNx).

(5) Coating a semiconductor-type carbon nanotube film on a surface of the gate insulating layer by a solution process (such as, spin-coating, dip-coating, or the like)

(6) Performing a photolithography process on the semiconductor-type carbon nanotube film to form an active layer pattern of the first-type carbon nanotube switch tube and an active layer pattern of the second-type carbon nanotube switch tube, in which performing of a developing process on the active layer pattern of the first-type carbon nanotube switch tube and the active layer pattern of the second-type carbon nanotube switch tube, an oxygen reactive ion etching is performed by using a photoresist mask to remove portions other than the active layer pattern of the first-type carbon nanotube switch tube and the active layer pattern of the second-type carbon nanotube switch tube, so as to form an active layer of the first-type carbon nanotube switch tube and an active layer of the second-type carbon nanotube switch tube.

(7) Depositing a second metal layer on the glass substrate, in which a thickness of the second metal layer may be 200 nm, a material of the second metal layer may be copper (Cu) or the like; performing a photolithography process on the second metal layer to form a source electrode pattern and a drain electrode pattern of the first-type carbon nanotube switch tube, in which after performing of a developing process on the source electrode pattern and the drain electrode pattern of the first-type carbon nanotube switch tube, a wet etching process is performed to form a source electrode and a drain electrode of the first-type carbon nanotube switch tube.

(8) Depositing a third metal layer on the glass substrate, in which a thickness of the third metal layer may be 200 nm, a material of the third metal layer may be lead (Pb) and the like; and performing a photolithography process on the third metal layer to form a source electrode pattern and a drain electrode pattern of the second-type carbon nanotube switch tube, in which after performing of a developing process on the source electrode pattern and the drain electrode pattern of the second-type carbon nanotube switch tube, a wet etching process is performed to form a source electrode and a drain electrode of the second-type carbon nanotube switch tube.

For example, data lines may be formed simultaneously with the source electrode and the drain electrode of the first-type carbon nanotube switch tube in step (7), or the data lines may also be formed simultaneously with the source electrode and the drain electrode of the second-type carbon nanotube switch tube in step (8).

(9) Depositing a first passivation layer film by plasma enhanced chemical vapor deposition (PECVD), removing redundant portions of the first passivation layer film by etching to form a first passivation layer; and then depositing a second passivation layer film by plasma enhanced chemical vapor deposition (PECVD) to form a second passivation layer, in which the second passivation layer can cover all regions of the glass substrate. For example, a material of the first passivation layer film may be silicon nitride (SiNx). A thickness of the second passivation layer film may be 300 nm, and a material of the second passivation layer film may be silicon oxide (SiOx).

(10) Performing a photolithography process and a developing process on the first passivation layer and the second passivation layer to form a plurality of via holes.

(11) Depositing a fourth metal layer by a sputtering process, and then performing a photolithography process, a developing process and an etching process on the fourth metal layer to form pixel electrodes (for example, the first sub-pixel electrode and the second sub-pixel electrode) of the sub-pixels. The first sub-pixel electrode is electrically connected to the drain electrode of the first-type carbon nanotube switch tube through a via hole, and the second sub-pixel electrode is electrically connected to the drain electrode of the second-type carbon nanotube switch tube through a via hole. For example, a thickness of the fourth metal layer may be 135 nm, and a material of the fourth metal layer may be indium tin oxide (ITO) or the like.

Through the above steps, the pixel structure provided by the embodiments of the present disclosure can be formed.

Figures 6, 7:
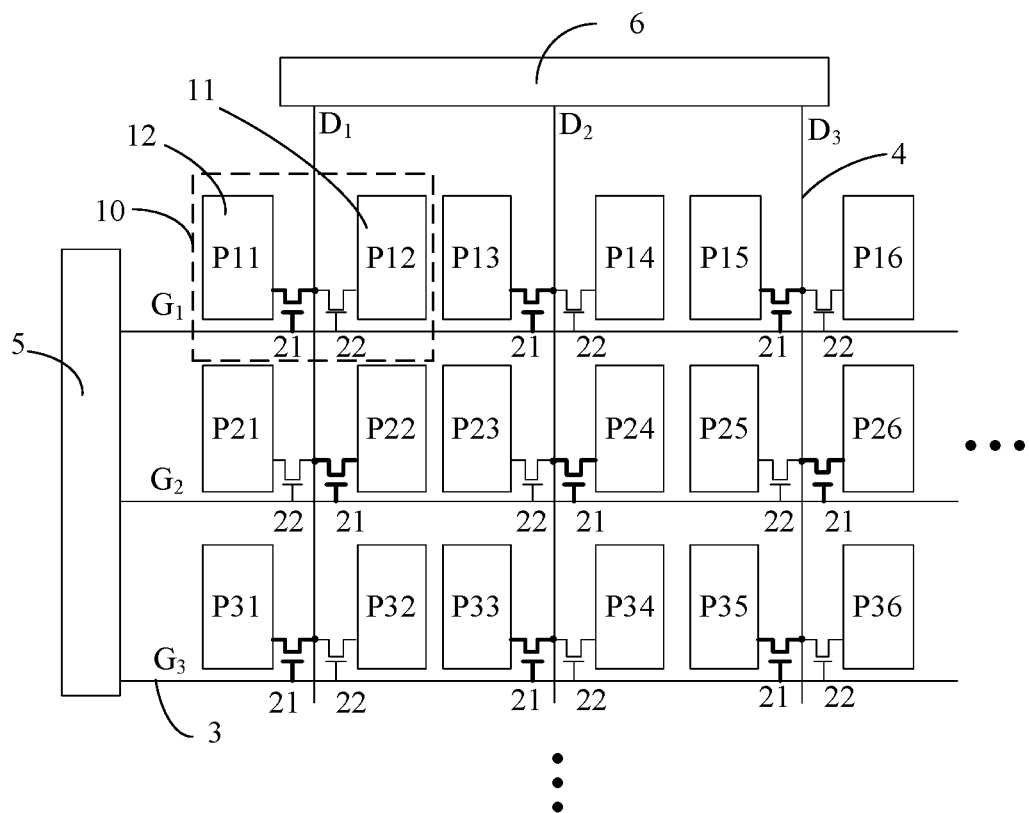
FIG. 6 is a schematic structural diagram of a pixel structure according to another embodiment of the present disclosure.
FIG. 7 is a schematic diagram of the pixel structure illustrated in FIG. 6 implementing dot inversion driving in a column-driving mode.

Another embodiment of the present disclosure provides a pixel structure. FIG. 6 is a schematic structural diagram of a pixel structure according to another embodiment of the present disclosure. FIG. 7 is a schematic diagram of the pixel structure illustrated in FIG. 6 implementing dot inversion driving in a column-driving mode.

Different from the embodiment illustrated in FIG. 1, in the embodiment illustrated in FIG. 6, in an odd row of the sub-pixel groups 10, the second sub-pixel electrode 12 is located in an odd column, and the first sub-pixel electrode 11 is located in an even column; however in an even row of the sub-pixel groups 10, the first sub-pixel electrode 11 is located in an odd column, and the second sub-pixel electrode 12 is located in an even column. In FIG. 6, P12, P14, P16, P21, P23, P25, P32, P34, and P36 are all the first sub-pixel electrodes 11, and P11, P13, P15, P22, P24, P26, P31, P33, and P35 are all the second sub-pixel electrode 12.

It should be noted that, other structures of the pixel structure in the embodiment illustrated in FIG. 6 are the same as those in the embodiment illustrated in FIG. 1, and details are not described herein again.

For example, because the first-type carbon nanotube switch tube 22 is turned on when a high level signal is input to a gate electrode thereof, and is turned off when a low level signal is input to the gate electrode thereof; the second-type carbon nanotube switch tube 21 is turned on when a low level signal is input to a gate electrode thereof, and is turned off when a high level signal is input to the gate electrode thereof. For example, as illustrated in FIG. 6 and FIG. 7, when a scan voltage of a high level is input to the gate line 3 correspondingly connected to the sub-pixel groups 10 located in the odd row, the first-type carbon nanotube switch tubes 22 in the sub-pixel groups 10 located in the odd row are turned on, at this time, a positive data voltage higher than a common voltage is input to the data line 4, the first sub-pixel electrodes 11 (such as, the sub-pixel electrode P12) in the sub-pixel groups 10 located in the odd row work to display under the driving of the first-type carbon nanotube switch tubes 22; when a scan voltage of a low level is input to the gate line 3 correspondingly connected to the sub-pixel groups 10 located in the odd row, the second-type carbon nanotube switch tubes 21 in the sub-pixel groups 10 located in the odd row are turned on, at this time, a negative data voltage lower than the common voltage is input to the data line 4, the second sub-pixel electrodes 12 (such as, the sub-pixel electrode P11) in the sub-pixel groups 10 located in the odd row work to display under the driving of the second-type carbon nanotube switch tubes 21.

Correspondingly, as illustrated in FIG. 6 and FIG. 7, when a scan voltage of a high level is input to the gate line 3 correspondingly connected to the sub-pixel groups 10 located in the even row, the first-type carbon nanotube switch tubes 22 in the sub-pixel groups 10 located in the even row are turned on, at this time, a positive data voltage higher than the common voltage is input to the data line 4, the first sub-pixel electrodes 11 (such as, the sub-pixel electrode P21) in the sub-pixel groups 10 located in the even row work to display under the driving of the first-type carbon nanotube switch tubes 22; when a scan voltage of a low level is input to the gate line 3 correspondingly connected to the sub-pixel groups 10 located in the even row, the second-type carbon nanotube switch tubes 21 in the sub-pixel groups 10 located in the even row are turned on, at this time, a negative data voltage lower than the common voltage is input to the data line 4, the second sub-pixel electrodes 12 (such as, the sub-pixel electrode P22) in the sub-pixel groups 10 located in the even row work to display under the driving of the second-type carbon nanotube switch tubes 21. As illustrated in FIG. 7, in each frame, a polarity of a data voltage on the first sub-pixel electrode 11 in each sub-pixel group 10 is opposite to a polarity of a data voltage on the second sub-pixel electrode 12 in each sub-pixel group 10. Therefore, the pixel structure achieves the dot inversion driving effect in the column-driving mode, thereby improving the display effect of the display device having the pixel structure.

For example, in the driving method of the pixel structure in the embodiment illustrated in FIG. 6, second sub-pixel electrodes in sub-pixel groups located in the odd row and second sub-pixel electrodes in sub-pixel group located in the even row are driven in the positive driving phase; correspondingly, first sub-pixel electrodes in the sub-pixel groups located in the odd row and first sub-pixel electrodes in the sub-pixel group located in the even row are driven in the negative driving phase.

The driving method and the manufacture method of the pixel structure in the embodiment illustrated in FIG. 6 are the same as those in the embodiment illustrated in FIG. 1, and details are not described herein again.

The beneficial effects of the present disclosure include at least: in the pixel structure illustrated in FIG. 1 and/or illustrated in FIG. 6, the first sub-pixel electrode in the sub-pixel group is connected to the first-type carbon nanotube switch tube, the second sub-pixel electrode in the sub-pixel group is connected to the second-type carbon nanotube switch tube, so that the pixel structure in the present disclosure is capable of achieving driving of the pixel structure in a case where sub-pixel groups in each row is connected to one gate line and sub-pixel groups in each column is connected to one data line, compared with an existing pixel structure, the pixel structure can reduce the number of gate lines by half without increasing the number of the data lines, thereby reducing the preparation and operation costs of the pixel structure; in addition, the pixel structure can implement the driving effect of dot inversion in the column-driving mode, thus improving the display effect of the display device adopting the pixel structure; meanwhile, in the pixel structure provided by the embodiments of the present disclosure, the materials of the source electrode and the drain electrode of the first-type carbon nanotube switch tube and the materials of the source electrode and the drain electrode of the second-type carbon nanotube switch tube are different, so the doping process is not required, and the first-type carbon nanotube switch tube and the second-type carbon nanotube switch tube can be manufactured by a sample patterning process, and therefore, the preparation processes of the first-type carbon nanotube switch tube and the second-type carbon nanotube switch tube are simpler, thereby reducing the preparation cost of the pixel structure and improving the preparation efficiency of the pixel structure.

At least one embodiment of the present disclosure further provides a display device, and the display device comprises the pixel structure described in any one of the above embodiments.

By adopting the pixel structure described in any one of the above embodiments, the preparation and operation costs of the display device can be reduced, the display effect of the display device can be improved, meanwhile, the preparation complexity of the display device can be simplified, and the preparation efficiency of the display device can be improved.

For example, the display device provided by the present disclosure may be a liquid crystal panel, a liquid crystal television, an OLED panel, an OLED television, a monitor, a mobile phone, a navigator, or any products or components having a display function.

For the present disclosure, the following statements should be noted:

(1) The accompanying drawings involve only the structure(s) in connection with the embodiment(s) of the present disclosure, and other structure(s) can be referred to common design(s).

(2) In case of no conflict, the embodiments of the present disclosure and the features in the embodiment(s) can be combined with each other to obtain new embodiment(s).

What have been described above are only specific implementations of the present disclosure, the protection scope of the present disclosure is not limited thereto, and the protection scope of the present disclosure should be based on the protection scope of the claims.

What is claimed is:

1. A pixel structure comprising a plurality of sub-pixel groups arranged in an array,
wherein each sub-pixel group of the plurality of sub-pixel groups comprises a first sub-pixel electrode, a second sub-pixel electrode, a first-type carbon nanotube switch tube, and a second-type carbon nanotube switch tube,
the first sub-pixel electrode is connected to the first-type carbon nanotube switch tube, the second sub-pixel electrode is connected to the second-type carbon nanotube switch tube, and the first-type carbon nanotube switch tube and the second-type carbon nanotube switch tube in each sub-pixel group are connected to a same gate line and a same data line;
an active layer of the first-type carbon nanotube switch tube and an active layer of the second-type carbon nanotube switch tube are formed simultaneously by a same process; and
a material for forming source-drain electrodes of the first-type carbon nanotube switch tube and a material for forming source-drain electrodes of the second-type carbon nanotube switch tube are different;
wherein the first-type carbon nanotube switch tube is an N-type carbon nanotube switch tube, and the second-type carbon nanotube switch tube is a P-type carbon nanotube switch tube; or
the first-type carbon nanotube switch tube is a P-type carbon nanotube switch tube, and the second-type carbon nanotube switch tube is an N-type carbon nanotube switch tube;
a material of a source electrode and a drain electrode of the N-type carbon nanotube switch tube is undoped copper or aluminum, and a material of a source electrode and a drain electrode of the P-type carbon nanotube switch tube is undoped lead.

2. The pixel structure according to claim 1, wherein the first sub-pixel electrode and the second sub-pixel electrode in each sub-pixel group are adjacent.

3. The pixel structure according to claim 2, wherein the first sub-pixel electrode and the second sub-pixel in each sub-pixel group are located in a same row.

4. The pixel structure according to claim 2, wherein in a same column of sub-pixel electrodes, the first sub-pixel electrode and the second sub-pixel electrode are alternately arranged.

5. The pixel structure according to claim 4, wherein in an odd row of the plurality of sub-pixel groups, the first sub-pixel electrode is located in an odd column, and the second sub-pixel electrode is located in an even column; and
in an even row of the plurality of sub-pixel groups, the second sub-pixel electrode is located in an odd column, and the first sub-pixel electrode is located in an even column.

6. The pixel structure according to claim 4, wherein in an odd row of the plurality of sub-pixel groups, the second sub-pixel electrode is located in an odd column, and the first sub-pixel electrode is located in an even column; and
in an even row of the plurality of sub-pixel groups, the first sub-pixel electrode is located in an odd column, and the second sub-pixel electrode is located in an even column.

7. The pixel structure according to claim 2, wherein in each sub-pixel group, the first-type carbon nanotube switch tube connected to the first sub-pixel electrode and the second-type carbon nanotube switch tube connected to the second sub-pixel electrode are respectively located at two sides of a data line that is connected to both the first-type carbon nanotube switch tube and the second-type carbon nanotube switch tube.

8. The pixel structure according to claim 7, wherein in each sub-pixel group, the second-type carbon nanotube switch tube and the first-type carbon nanotube switch tube are mirror-symmetrical with the data line as a symmetry axis.

9. The pixel structure according to claim 2, wherein first-type carbon nanotube switch tubes and second-type carbon nanotube switch tubes in sub-pixel groups located in a same row are connected to a same corresponding gate line, and first-type carbon nanotube switch tubes and second-type carbon nanotube switch tubes in sub-pixel groups located in a same column are connected to a same corresponding date line.

10. A display device, comprising the pixel structure according to claim 1.

11. The pixel structure according to claim 8, wherein in each sub-pixel group, the first sub-pixel electrode and the second sub-pixel electrode are mirror-symmetrical with the corresponding data line as a symmetry axis.

12. The pixel structure according to claim 1, wherein a channel material the first-type carbon nanotube switch tube and a channel material of the second sub-pixel electrode are same.

13. A method of manufacturing a pixel structure, comprising:
forming a plurality of sub-pixel groups arranged in an array,
wherein each sub-pixel group of the plurality of sub-pixel groups comprises a first sub-pixel electrode, a second sub-pixel electrode, a first-type carbon nanotube switch tube, and a second-type carbon nanotube switch tube,
the first sub-pixel electrode is connected to the first-type carbon nanotube switch tube, the second sub-pixel electrode is connected to the second-type carbon nanotube switch tube, the first-type carbon nanotube switch tube and the second-type carbon nanotube switch tube in each sub-pixel group are connected to a same gate line and a same data line,
an active layer of the first-type carbon nanotube switch tube and an active layer of the second-type carbon nanotube switch tube are simultaneously formed by a same process; and
source-drain electrodes of the first-type carbon nanotube switch tube and source-drain electrodes of the second-type carbon nanotube switch tube are respectively formed of different materials;
wherein the first-type carbon nanotube switch tube is an N-type carbon nanotube switch tube, and the second-type carbon nanotube switch tube is a P-type carbon nanotube switch tube; or
the first-type carbon nanotube switch tube is a P-type carbon nanotube switch tube, and the second-type carbon nanotube switch tube is an N-type carbon nanotube switch tube;
a source electrode and a drain electrode of the N-type carbon nanotube switch tube is formed of undoped copper or aluminum, and a source electrode and a drain electrode of the P-type carbon nanotube switch tube is formed of undoped lead.

14. A method of driving a pixel structure, wherein the pixel structure comprises a plurality of sub-pixel groups arranged in an array, each sub-pixel group of the plurality of sub-pixel groups comprises a first sub-pixel electrode, a second sub-pixel electrode, a first-type carbon nanotube switch tube, and a second-type carbon nanotube switch tube, the first sub-pixel electrode is connected to the first-type carbon nanotube switch tube, the second sub-pixel electrode is connected to the second-type carbon nanotube switch tube, and the first-type carbon nanotube switch tube and the second-type carbon nanotube switch tube in each sub-pixel group are connected to a same gate line and a same data line, an active layer of the first-type carbon nanotube switch tube and an active layer of the second-type carbon nanotube switch tube are formed simultaneously by a same process; a material for forming source-drain electrodes of the first-type carbon nanotube switch tube and a material for forming source-drain electrodes of the second-type carbon nanotube switch tube are different, wherein the first-type carbon nanotube switch tube is an N-type carbon nanotube switch tube, and the second-type carbon nanotube switch tube is a P-type carbon nanotube switch tube; or the first-type carbon nanotube switch tube is a P-type carbon nanotube switch tube, and the second-type carbon nanotube switch tube is an N-type carbon nanotube switch tube;

a material of a source electrode and a drain electrode of the N-type carbon nanotube switch tube is undoped copper or aluminum, and a material of a source electrode and a drain electrode of the P-type carbon nanotube switch tube is undoped lead;

and driving of each sub-pixel group comprises a positive driving phase and a negative driving phase;

the driving method comprises:

in the positive driving phase, inputting a first scan voltage to the first-type carbon nanotube switch tube of each sub-pixel group through a gate line, so as to turn on the first-type carbon nanotube switch tube; inputting a first data voltage to the first-type carbon nanotube switch tube through a data line, the first-type carbon nanotube switch tube driving the first sub-pixel electrode to display;

in the negative driving phase, inputting a second scan voltage to the second-type carbon nanotube switch tube of each sub-pixel group through the gate line, so as to turn on the second-type carbon nanotube switch tube; inputting a second data voltage to the second-type carbon nanotube switch tube through the data line, the second-type carbon nanotube switch tube driving the second sub-pixel electrode to display, wherein a polarity of the first data voltage and a polarity of the second data voltage are opposite.

15. The method of driving the pixel structure according to claim 14, wherein in an (N)th frame, the polarity of the first data voltage is positive, and the polarity of the second data voltage is negative;

in an (N+1)th frame, the polarity of the first data voltage is negative, and the polarity of the second data voltage is positive, and N is a positive integer.

16. The method of driving the pixel structure according to claim 14, wherein first sub-pixel electrodes in sub-pixel groups located in an odd row and first sub-pixel electrodes in sub-pixel group located in an even row are driven in the positive driving phase; and second sub-pixel electrodes in the sub-pixel groups located in the odd row and second sub-pixel electrodes in the sub-pixel group located in the even row are driven in the negative driving phase.

17. The method of driving the pixel structure according to claim 14, wherein second sub-pixel electrodes in sub-pixel groups located in an odd row and second sub-pixel electrodes in sub-pixel group located in an even row are driven in the positive driving phase; and first sub-pixel electrodes in the sub-pixel groups located in the odd row and first sub-pixel electrodes in the sub-pixel group located in the even row are driven in the negative driving phase.

\* \* \* \* \*